United States Patent [19]

Hirao

[11] Patent Number: 4,691,436
[45] Date of Patent: Sep. 8, 1987

[54] METHOD FOR FABRICATING A BIPOLAR SEMICONDUCTOR DEVICE BY UNDERCUTTING AND LOCAL OXIDATION

[75] Inventor: Tadashi Hirao, Itami, Japan

[73] Assignee: Mitsubishi Denki Kabushiki Kaisha, Tokyo, Japan

[21] Appl. No.: 893,934

[22] Filed: Aug. 6, 1986

[30] Foreign Application Priority Data

Aug. 14, 1985 [JP] Japan .................. 60-179732
Nov. 6, 1985 [JP] Japan .................. 60-249610

[51] Int. Cl.⁴ .................. H01L 21/302; H01L 21/314
[52] U.S. Cl. .................. 437/33; 357/34; 357/59; 148/DIG. 124; 148/DIG. 10; 156/653; 437/69; 437/233
[58] Field of Search ............ 29/576 W, 576 B, 591, 29/578; 357/34, 59 H; 148/DIG. 124, DIG. 10; 156/653

[56] References Cited

U.S. PATENT DOCUMENTS 4,318,751 3/1982 Horng .................. 357/59 H

Primary Examiner—Brian E. Hearn
Assistant Examiner—Kevin McAndrews
Attorney, Agent, or Firm—Lowe Price LeBlanc Becker & Shur

[57] ABSTRACT

A method for fabricating bipolar transistors comprises a step of forming a multi-layered film consisting of a polysilicon film (600), a silicon nitride film (202) and a silicon oxide film (104) on an emitter region (7) and on an external base region (54, 56), a step of causing the silicon oxide film (104) to recede inwardly from the polysilicon film (600) and silicon nitride (202) film, a step of patterning the polysilicon film (600) by using the inwardly receded oxide film (104) as a mask while defining the external base region (54, 56), a step of forming an emitter region (7) and an active base region (6) by using the patterned polysilicon as an impurity diffusion source while self-alignedly forming an external base region (54, 56), and a step of self-alignedly forming an insulation film (107, 203) for electrical isolation between base and emitter electrode interconnections (9) on the side wall of the polysilicon film (603) by means of anisotropic etching.

10 Claims, 36 Drawing Figures

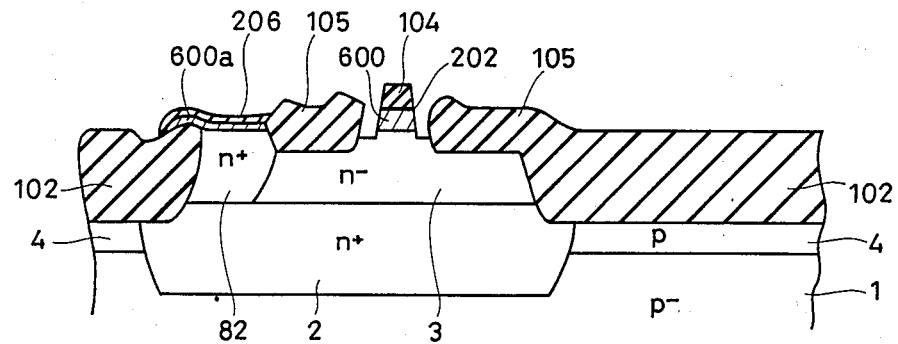
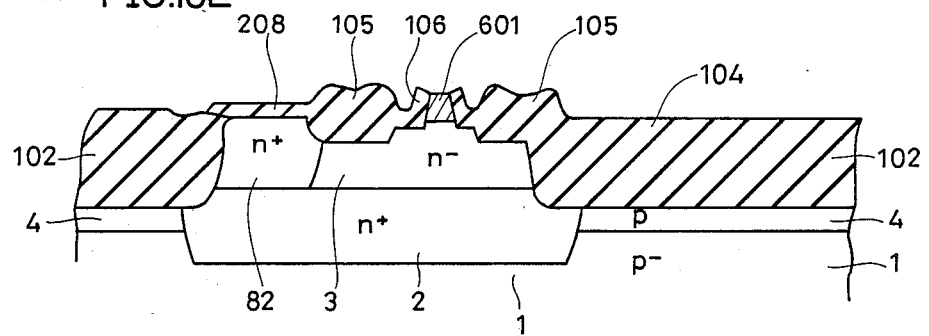
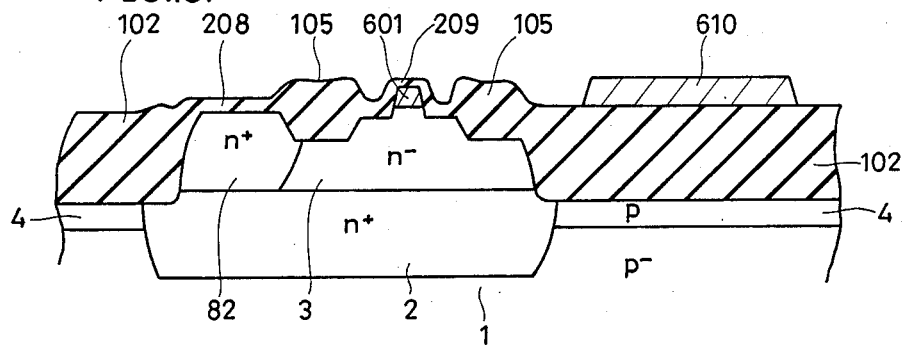

METHOD FOR FABRICATING A BIPOLAR SEMICONDUCTOR DEVICE BY UNDERCUTTING AND LOCAL OXIDATION

BACKGROUND OF THE INVENTION

1. Field of the Invention

This invention relates to a method for fabricating semiconductor devices and particularly to improvements in a method for forming a base electrode lead-out region for a transistor in a bipolar type semiconductor integrated circuit device and in a method for forming a base current feeding resistor to be connected to the base of said transistor.

2. Description of the Prior Art

Generally, a transistor in a bipolar type semiconductor integrated circuit device is formed in an electrically separated island by such a method as pn junction isolation process, oxide isolation process using selective oxidation process, or triple diffusion process. Herein will be described a method of forming npn transistors by oxidation isolation process. In a bipolar type semiconductor integrated circuit device, its components are, generally, transistors, diodes and resistors, said diodes being made by the same fabricating process as used for said transistors. Thus, herein will be described a semiconductor device in the form of a combination of transistors and resistors, i.e., a semiconductor device shown in FIG. 1 which has a transistor Tr with a base current feeding resistor R connected to its base B.

FIGS. 2A through 2E are views, showing conventional main fabrication steps, of a transistor with a resistor connected to its base. A conventional method for fabrication will now be described with reference to FIGS. 2A through 2E.

First, as shown in FIG. 2A, in a p-type silicon semiconductor substrate 1 of low impurity concentration (i.e., $p^-$-type) is selectively formed a first and a second high impurity concentration n type ($n^+$-type) layers 2a and 2b serving as collector buried layers, on which an $n^-$-type epitaxial layer 3 is grown.

Next, as shown in FIG. 2B, a pad oxide film 101 and a nitride film 201 are successively formed on the $n^-$-type epitaxial layer 3, and the nitride film 201 is patterned into a predetermined form. With said patterned nitride film 201 used as a mask, selective oxidation is applied to form a thick isolation oxide film 102 which surrounds a transistor forming region and a resistor forming region. In this oxidation process, a p-type channel-cutting layer 4 is simultaneously formed under the isolation oxide film 102. As a result, the transistor forming regions and the resistor forming regions are respectively formed in predetermined areas. For the sake of convenience of description, the $n^-$-type epitaxial layer 3 which forms the collector region of the transistor will be hereinafter referred to as a first $n^-$-type layer 3a and the $n^-$-type epitaxial layer 3 for the resistor region as a second epitaxial layer 3b.

Then, as shown in FIG. 2C, the nitride film 201 used as a mask for said selective oxidation is removed together with the pad oxide film 101, and then oxide films 103 serving as protective films for ion implantation are formed on the $n^-$-type epitaxial layers 3a and 3b. Subsequently, with a photoresist film (which, at this stage, is not shown) used as a mask, a $p^-$-type layer 5 serving as an external base layer is formed such that one side wall thereof contacts the isolation oxide film 102 which isolates the transistor and the resistor regions from each other. Further, the photoresist film used as the mask is then removed and photoresist films 301 of predetermined shape are formed. Then, with photoresist films 301 used as masks, ion implantation is effected such that in the surface of the first $n^-$-type epitaxial layer 3a is formed a p-type layer 6 serving as an active base region with one side wall thereof contacting the external base layer 5 and that in the surface of second $n^-$-type epitaxial layer 3b is formed a p-type layer 9 serving as a resistor region.

Subsequently, as shown in FIG. 2D, the photoresist film 301 is removed and a passivation film 401 generally made of phosphosilicate glass (PSG) is deposited on the entire surface, and a heat treatment is performed for annealing of the ion-implanted external base layer 5 and active base region 6 as well as for thermal shrinking of the PSG film 401, thereby forming the external base layer 5 and the active base layer 6 in intermediate state and resistor region 9. Then, openings 70 and 80 are formed in predetermined regions of the PSG film 401, and ion implantation is effected through the openings 70 and 80, whereby in a portion of the the surface of the active base layer 6 is formed an $n^+$-type layer 7 serving as an emitter layer and in a portion of the surface of the first $n^-$-type epitaxial layer 3a is formed an $n^+$-type layer 8 serving as a collector electrode lead-out layer.

Then, as shown in FIG. 2E, each ion-implanted layer is annealed to complete the external base layer 5, active base region 6 and resistor region 9 while the emitter region 7 and the collector electrode lead-out layer 8 are formed, and then an opening 50 for leading out the base electrode and openings 91 and 92 for leading out the resistor electrodes are formed. On the bottom of each of the openings 50, 70, 80, 91 and 92 is formed a metal silicide film 501 for preventing electrode penetration (prevention of reaction between the electrode material and the semiconductor substrate). The metal silicide films 501 are formed, e.g., of platinum silicide Pt-Si or palladium silicide Pd-Si. Then, a low resistance metal, such as aluminum Al, is used to form a base electrode interconnection 12, an emitter electrode interconnection 10, a collector electrode interconnection 11, a base-resistor interconnection 13 and a resistor electrode interconnection 14.

FIG. 3 is a plan pattern view of the transistor and resistor formed by abovesaid method shown in FIGS. 2A through 2E. In FIG. 3, the base electrode interconnection 12, the emitter electrode interconnection 10, and the collector electrode interconnection 11 are disposed parallel to each other and are electrically connected to the external base region 5, the emitter region 7, and the collector electrode lead-out region 8 through the contact holes 50, 70, and 80, respectively. Problems associated with the prior art semiconductor device will now be described with reference to FIG. 3.

The frequency characteristic of transistors depends on such factors as base-collector capacitance and base resistance and these factors must be reduced in order to improve the frequency characteristic. In the aforesaid construction, the $p^+$-type external base layer 5 has been provided to reduce the base resistance; however, this has the drawback of increasing the base area and hence the base-collector capacitance. Further, the base resistance also depends on the distance D1 between the emitter region 7 and the base electrode opening 50. In the conventional construction, the distance D1 is the sum of the spacing between the base electrode interconnection 12 and the emitter electrode interconnection 10 and the distances by which the electrode interconnections 9 and 10 protrude beyond the openings 50 and 70, respectively. Even if photoetching accuracy is improved to reduce the spacing of the electrode interconnections, said protrusion distances cannot be eliminated; thus, there has been a limit to the reduction of the distance D1.

Further, since the resistor region 9 connected to the base of the transistor is formed of diffusion resistance, it is necessary to isolate the transistor and the resistor regions from each other by the isolation oxide film 102, thus making it difficult to increase the degree of integration. Furthermore, since the resistor region 9 is isolated by the pn junction, there is created a capacitance which forms a cause of degradation of frequency characteristic.

Further, the base region between the emitter layer 7 and the isolation oxide film boundary A shown in FIG. 3 is an inactive region, which increases the base-emitter capacitance. For elimination of this inactive region, there is a method using a walled-emitter construction in which the emitter layer 7 contacts the isolation oxide film. Even this method, however, encounters various drawbacks.

FIGS. 4A through 4C are views, shown in the order of fabrication steps, of a portion of a section taken along the line X—X in FIG. 3. Problems of the conventional walled emitter construction will now be described with reference to FIGS. 4A through 4C.

FIG. 4A shows a state in which for the formation of the base region, a p-type impurity such as boron has been implanted with the photoresist film 301 serving as a mask. Then, to form a contact hole, it is necessary to remove the oxide film 103 on the emitter region 7. However, in this walled-emitter construction, as shown in FIG. 4B, the boundary A of the isolation oxide film 102 is overetched during removal of the oxide film, so that the emitter region is deepened, as shown at the portion B in FIG. 4C. As a result, controllability of current amplification rate is degraded and there is the increased danger of a short-circuit taking place between the emitter and the collector at the portion B shown in FIG. 4C.

Further, double base construction, as shown in FIG. 5, is often used as a countermethod for reducing the base resistance. In the conventional method, however, there is a drawback that the provision of a base electrode lead-out region results in an increase in the size of the base region, leading to an increase in the base-collector capacitance.

Further, in the conventional method, the emitter-base junction is located deeper than the surface of the external base region, resulting in a drawback that current amplification factor depends more on electric current. That is, there is a problem that in a small level current region, electric current is absorbed in the interfaces (such as one between the emitter and the external base region) through recombination of electric charges and the like, whereby controllability of current amplification factor is degraded.

The prior arts concerning the present invention are as follows:

(1) S konaka et al., "A 30 ps Bipolar IC Using Self-Aligned Process Technology," Extended Abstract of the 16th Conference on Solid State Devices and Materials, 1984, pp 209-212;

(2) N Oh-uchi et al., "A New Self-Aligned Transistor Structure for High Speed and Low-Power Bipolar LSI's," Proceedings of the IEEE International Electron Devices Meeting, December 1983, pp 55-58; and (3) D. D. Tang et al., "Subnanosecond Self-Aligned I$^2$L/MTL Circuits," IEEE Transaction on Electron Devices, Vol. ED-27, No. 8, August 1980.

The prior art (1) discloses a method for self-alignedly forming a base and emitter by using a single mask.

The prior art (2) discloses a method for forming an emitter of substantially the same area as that of the base region self-alignedly with respect to the isolation oxide region and the base region by surrounding the active region with the isolation oxide region and using a selective growth method.

The prior art (3) discloses a method for electrically isolating the base electrode interconnection and the emitter electrode interconnection from each other by leaving only the oxide film on a polysilicon side wall serving as an electrode interconnection through application of anisotropic etching.

SUMMARY OF THE INVENTION

An object of the present invention is to provide a method for fabricating semiconductor devices, which method eliminates the aforesaid drawbacks, reduces the base resistance and base-collector capacitance, lowers the dependence of current amplification factor on electric current in the low current region, and implements a bipolar transistor having a superior frequency characteristic.

Another object of the invention is to provide a method for fabricating semiconductor devices comprising bipolar transistors and resistors, which method reduces the base resistance and base-collector capacitance and eliminates parasitic capacitance in the current feeding resistor, whereby the frequency characteristic is improved.

The method for fabricating semiconductors according to the present invention comprises the steps: forming a silicon film serving as an impurity diffusion source for forming an emitter region on a semiconductor substrate region to be the emitter region; forming a base region by ion implantation partly through the silicon film; self-alignedly forming the emitter region in the base region by using said silicon film; self-alignedly forming an insulation film between a silicon film on the emitter region and the base electrode lead-out region to insulate the base region from an emitter electrode; and self-alignedly forming a base electrode lead-out region. In this process, the emitter-base junction is located shallower than the surface of the external base region but at the same depth as that of the base electrode lead-out region.

In the method for fabricating semiconductor devices having a base current feeding resistor, the aforesaid method is used to form a bipolar transistor while simultaneously using a silicon film to form a resistor on the isolation oxide film.

Since the emitter region is self-alignedly formed in the base region, a minimized base electrode lead-out region is self-alignedly formed around the emitter and the silicon film with respect to a patterning mask for formimg the silicon film which serves as an impurity source for the emitter region and which is connected to a metal electrode.

Further, since only the insulating film is interposed between the silicon film on the emitter region and the metal interconnection on the base region, the distance between the emitter and the base is reduced, being substantially equal to the thickness of the insulation film.

Further, since the emitter region is formed by diffusing the impurity from the silicon film serving as an impurity source into the region which is to be an emitter region, there is no need to form a contact hole for ion implantation for formation of the emitter region. Thus, there is no need to remove the oxide film on the emitter region, and since there is no possibility of occurrence of overetching at the boundary of isolation oxide film, the emitter and the base regions contact the isolation region in substantially parallel relationship.

Further, since the base current feeding resistor is formed on the isolation oxide film, parasitic capacitance thereof can be eliminated.

These and other objects and features will become more apparent from the following detailed description to be given with reference to the accompanying drawings.

BRIEF DESCRIPTION OF THE DRAWINGS

FIGS. 10A through 10K are sectional views, showing main successive fabrication steps, of a semiconductor device comprising resistors and transistors, according to another embodiment of the present invention.

DESCRIPTION OF THE PREFERRED EMBODIMENTS

FIGS. 6A through 6J are sectional views, at main successive fabrication steps, showing a method for fabricating semiconductor devices according to an embodiment of the present invention. A method for fabricating semiconductor devices according to an embodiment of the present invention will now be described with reference to FIGS. 6A through 6J.

Figure 1:
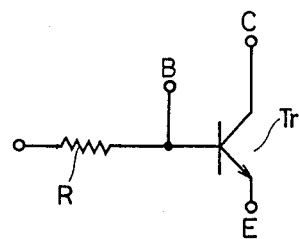
FIG. 1 shows a symbol for a bipolar transistor having a resistor connected to its base.
Figure 6A:
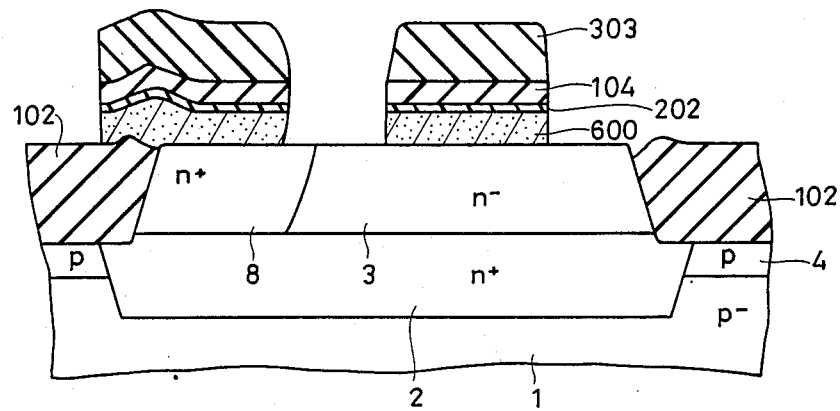
FIGS. 6A through 6J are sectional views, showing main successive fabrication steps, of a semiconductor device according to an embodiment of the present invention.

Referring to FIG. 6A, a $p^-$-type silicon substrate 1 is prepared, in predetermined regions thereof, with an $n^+$-type collector buried layer 2, an $n^-$-type epitaxial layer 3, a channel cutting p-type layer 4, an isolation oxide layer 102, and an $n^+$-type diffusion layer 8 serving as a collector electrode lead-out region. The formation in each region is effected using the same method as the conventional method shown in FIGS. 1A and 1B. Then, the pad oxide film 101 and the nitride film 201 shown in FIG. 1B are removed, a silicon film, preferably polysilicon film 600, a nitride film 202 and an oxide film 104 are formed on the semiconductor substrate 1 in the order mentioned. Subsequently, with a resist film 303 of predetermined pattern used as a mask, a multilayer film which consists of the polysilicon film 600, nitride film 202 and oxide film 104 is etched. As a result of this patterning, a multilayer film consisting of an oxide film 104, nitride film 202 and polysilicon film 600 is left only in the regions which will later serve as a collector electrode lead-out layer and an emitter layer.

Figure 6B:
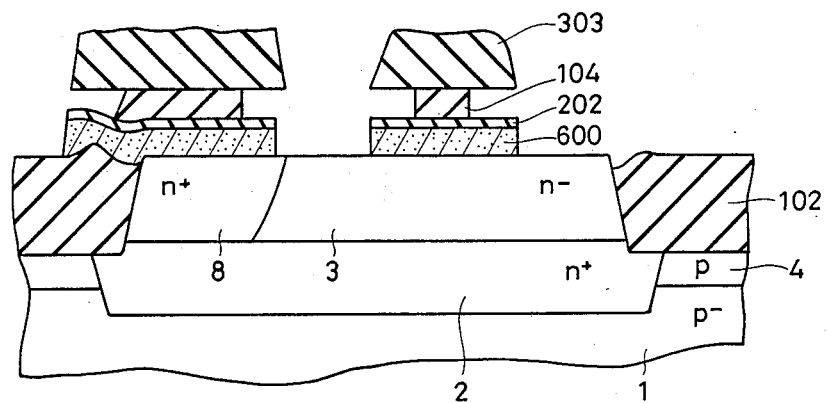

Reference will be made to FIG. 6B. The resist film 303 used for the patterning of the multilayer film in the above process is then used as a mask for side-etching only the side wall of the oxide film 104 included in the multilayer film. As a result, the oxide film 104 recedes inwardly from the polysilicon film 600 and nitride film 202.

Figure 6C:
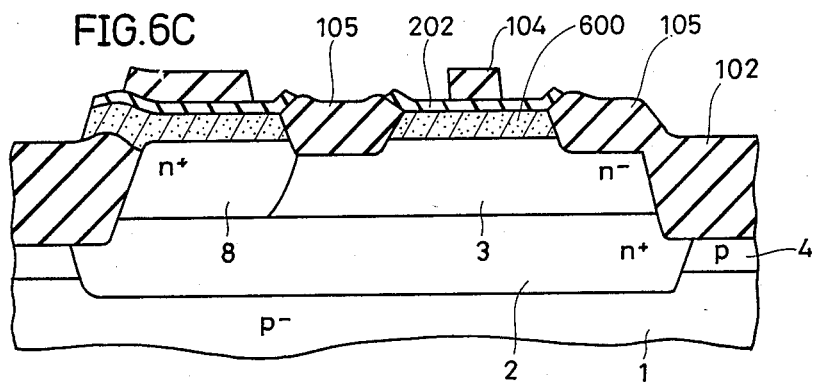

In FIG. 6C, after removal of the resist film 303, selective oxidation is effected using the nitride film 202 as a mask so as to form an oxide film 105 on a predetermined region of the semiconductor substrate 1.

Figure 6D:
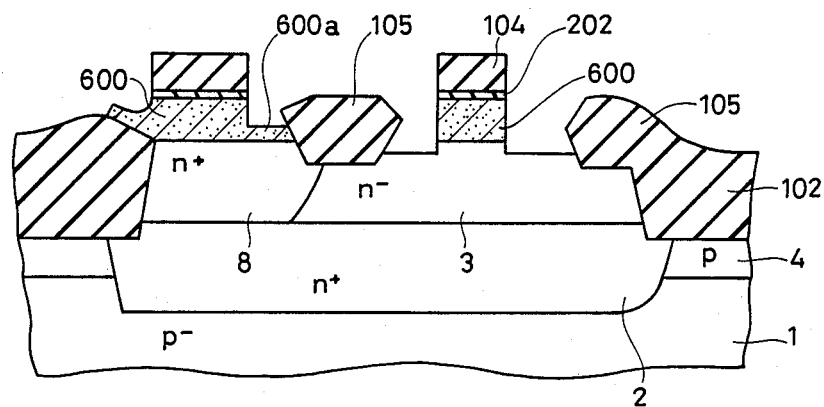

In FIG. 6D, with the oxide film 104 as a mask, etching is effected to pattern the nitride film 202 and the polysilicon film 600 under the nitride film 202, and then by a predetermined thickness the silicon substrate ($n^-$ layer 3) is removed by etching in order to thin the portion serving as a base electrode. The process is effected to make current amplification factor less dependent on electric current by forming the emitter junction (between the active base region and the emitter region) at the same depth as that of the base current lead-out layer. That is, absorption of current due to recombination is eliminated to enable current amplification factor to be reliably controlled even in a low current region.

Figure 6E:
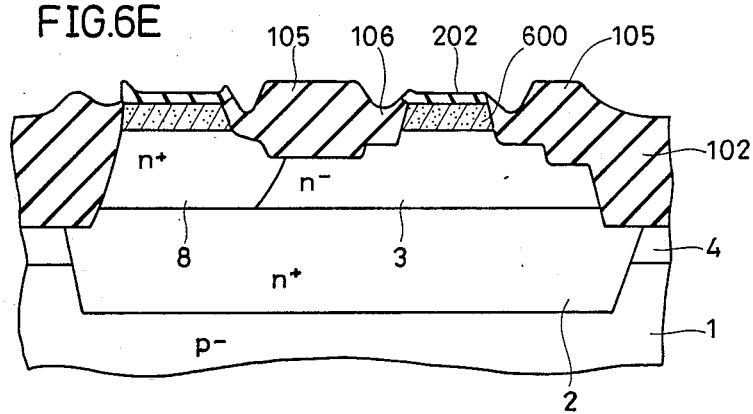

Reference will be made to FIG. 6E. After removal of the oxide film 104, selective oxidation is effected using the nitride film 202 as a mask to form an oxide film 106 on the semiconductor substrate between the polysilicon film 600 and the oxide film 105. In this process, selective oxidation is effected to the extent that not only the thinned polysilicon film 600a but also the $n^-$-type semiconductor region 106 disposed thereunder is more or less oxidized. The oxide film 106 covers the side wall of the polysilicon film 600.

Figure 6F:
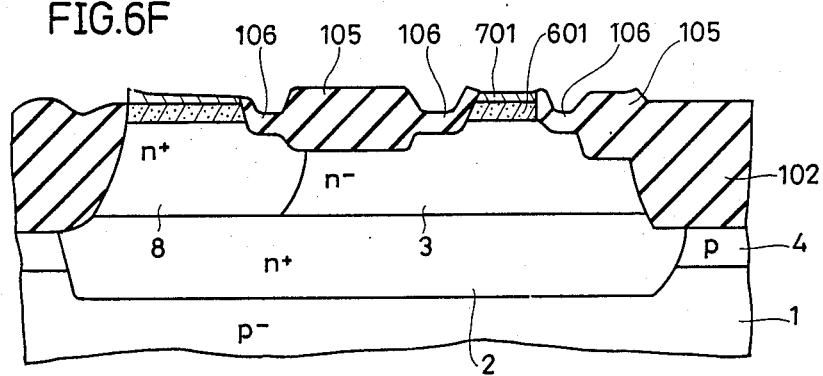

In FIG. 6F, first, the nitride film 202 is removed. Then, with the thin oxide film 106 used as a mask, an $n^+$-type impurity is introduced into the polysilicon film 600, whereby an impurity-containing polysilicon film 601 is formed. Thus, the polysilicon film 601 serves as an impurity diffusion source for forming the emitter region. Subsequently, to reduce the emitter resistance, a metal silicide film 701 made, for example, of titanium silicide $TiSi_2$ is self-alignedly formed on the polysilicon film 601. That is, the upper portion of the polysilicon film 601 is transformed into a metal silicide film 701. Titanium silicide ($TiSi_2$) can be self-alignmenedly formed only on the portion contacting the silicon surface and can thereafter be treated at high temperature without paying any special attention, as is well known in the art.

Figure 6G:
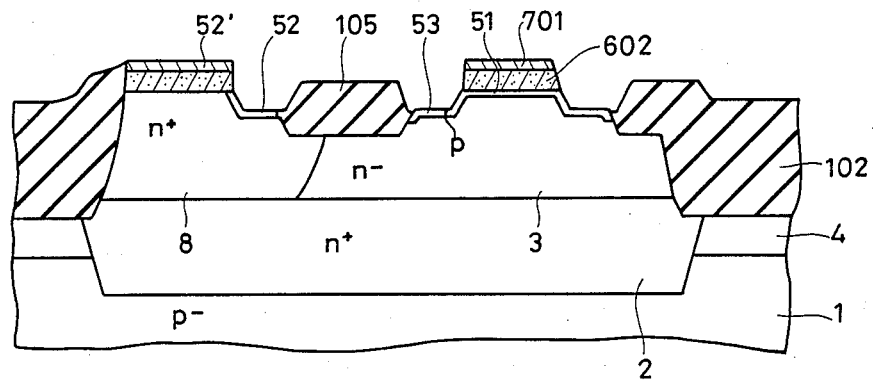

In FIG. 6G, after removal of the oxide film 106, a p-type impurity is implanted to form ion-implanted regions 51, 52, 52' and 53. In this process, the portion of the n⁻-type semiconductor region where the oxide film 106 is removed serves as an external base layer. On the other hand, the oxide film 105 is left in order to isolate the base and the collector regions from each other. Thus, the oxide film 105 is made as thick as 1 μm in selective oxidation process in FIG. 6C, and the oxide film 106 is made as thin as 200-300 nm in selective oxidation process in FIG. 6E. Further, the p-type layers 52' and 52 formed by implanting ions into the collector electrode lead-out region have almost negligible amounts of impurity due to the collector electrode lead-out n⁺ diffusion layer 8 and have almost no influence on the collector electrode lead-out diffusion layer 8. Further, the ion implanted region serving as an active base layer disposed under the polysilicon film 602 (the polysilicon film 601 having p-type impurity implanted therein) is formed shallower than the region 53 serving as an external base layer since p-type impurity is ion-implanted through the polysilicon film 602.

Figure 6H:
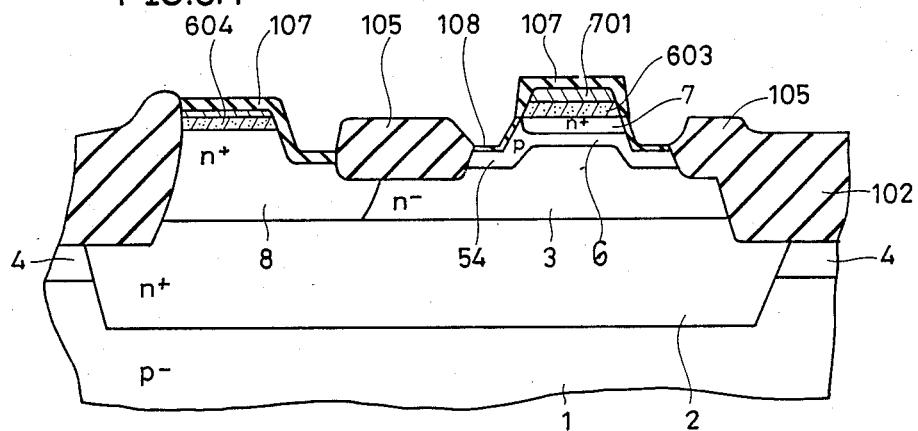

In FIG. 6H, the annealing of the p-type ion-implanted layer is effected simultaneously with the diffusion of n⁺-type impurity from the polysilicon film 602 into the silicon substrate 3. As a result, the emitter region 7 is self-alignedly formed and the external base region 54 is formed somewhat deeper and lower in resistance than the active base region 6. Then, oxidation at low temperature of the order of 800°-900° C. is effected, whereby a thick oxide film 107 is formed on n⁺-type polysilicon films 603 and 604 including the metal silicide film, and a thin oxide film 108 is formed on the p⁺-type silicon substrate 54. This process is based on the well-known fact that in silicon or polysilicon which contains a highly concentrated n-type impurity such as phosphorus or arsenic, oxidation process the faster, the lower the temperature.

Figure 6I:
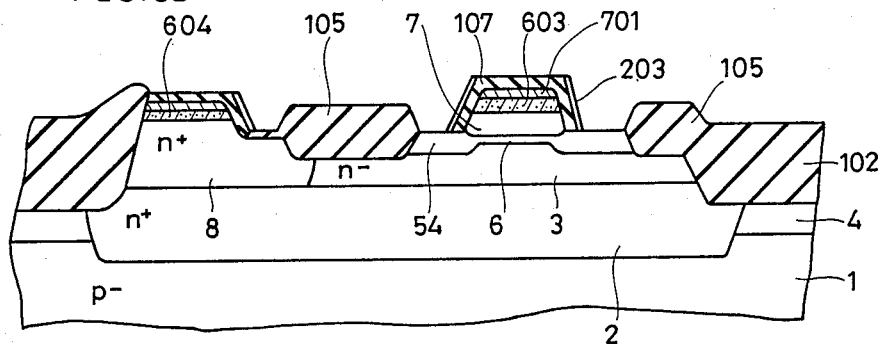

In FIG. 6I, anisotropic etching RIE (reactive ion-beam etching) is applied to the oxide films 107 and 108 formed on the polysilicon films 603 and 604 including the metal silicide film, thereby removing the thin oxide film 108 formed on the external base region 54. Among methods of preventing the base electrode from being shorted to the emitter layer 7 is one which comprises the steps of depositing a nitride film 203 on the entire surface shown in FIG. 6H, effecting anisotropic etching in such a manner as to leave the nitride film 203 only on the side wall of the polysilicon film 603, and removing the oxide film 108 by using RIE again, thus leaving the oxide and nitride films on the side wall of the polysilicon film 603. FIG. 6I shows this state.

Figure 6J:
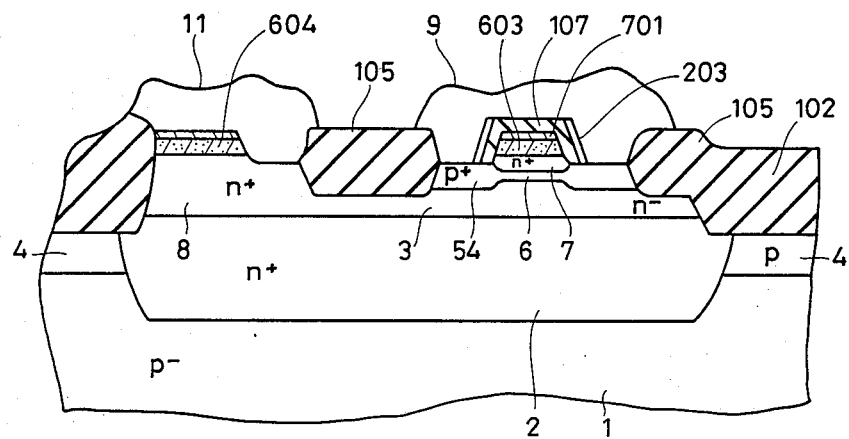

In FIG. 6J, first, the thick oxide film 108 on the collector electrode lead-out region 8 is removed. Then, selective etching is applied to predetermined regions to form a contact hole 70 for an emitter electrode (not shown in FIG. 6J) and a contact hole 80 for a collector electrode. Then, an emitter interconnection 10 (not shown in FIG. 6J) and a collector interconnection 11 are formed using a low resistance metal, e.g., Al. As can be seen in FIG. 6J, the emitter-to-base distance is very short, being substantially equal to the sum of the thicknesses of the oxide film 107 and the nitride film 203 on the side wall of the polysilicon film 603.

Figure 3:
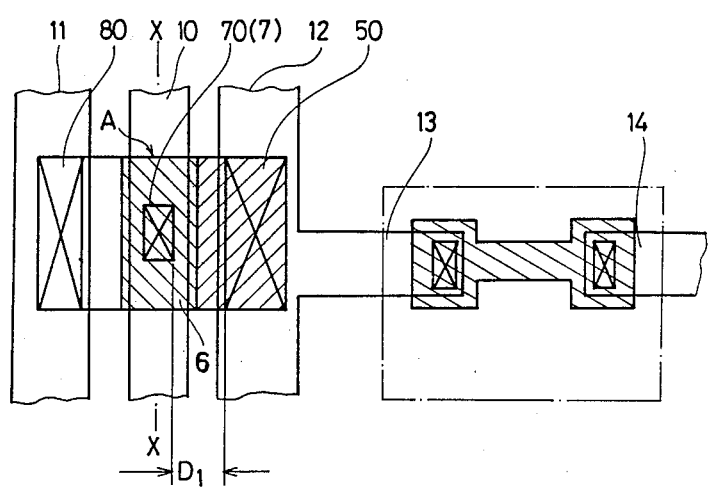
FIG. 3 is a plan pattern view of a transistor circuit device produced by the conventional method.
Figure 2A:
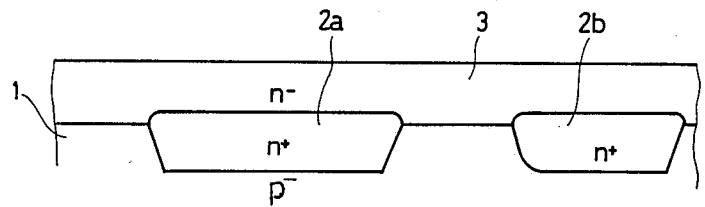
FIGS. 2A through 2E are sectional views showing a conventional method for fabricating the semiconductor device shown in FIG. 1.
Figure 2B:
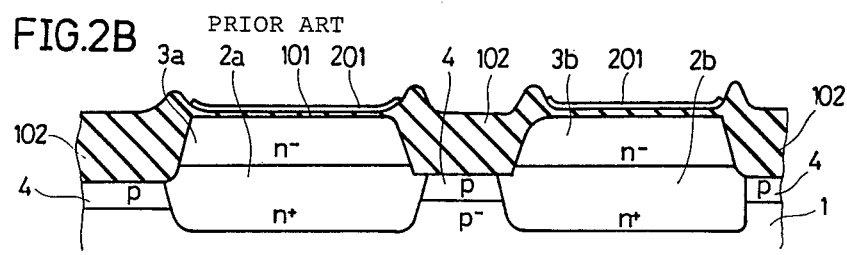
Figure 2C:
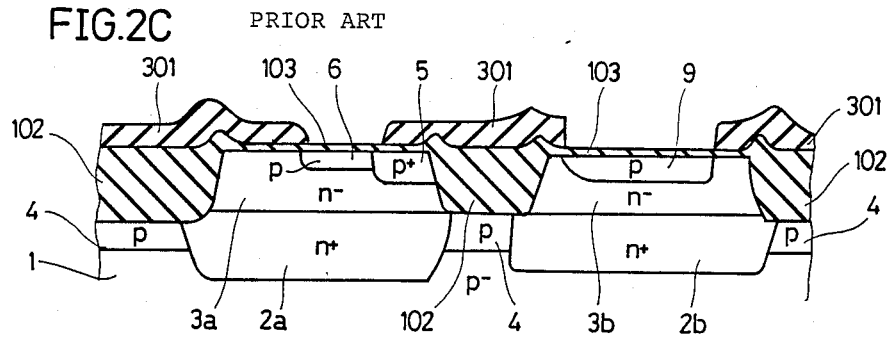
Figure 2D:
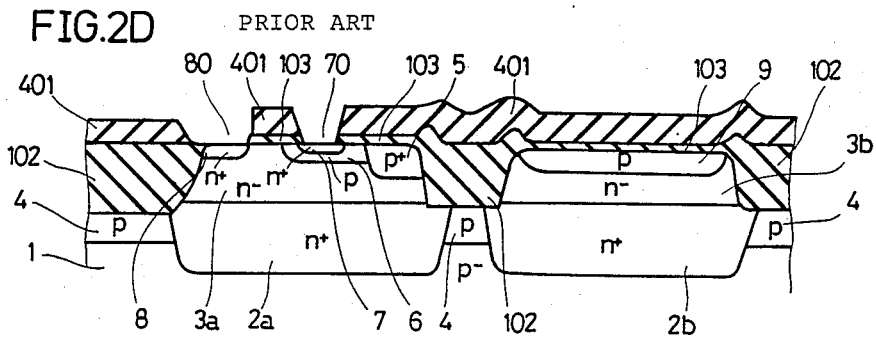
Figure 2E:
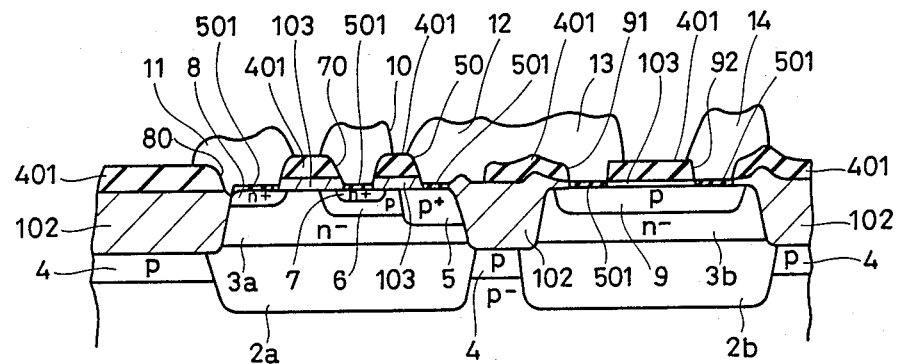
Figure 5:
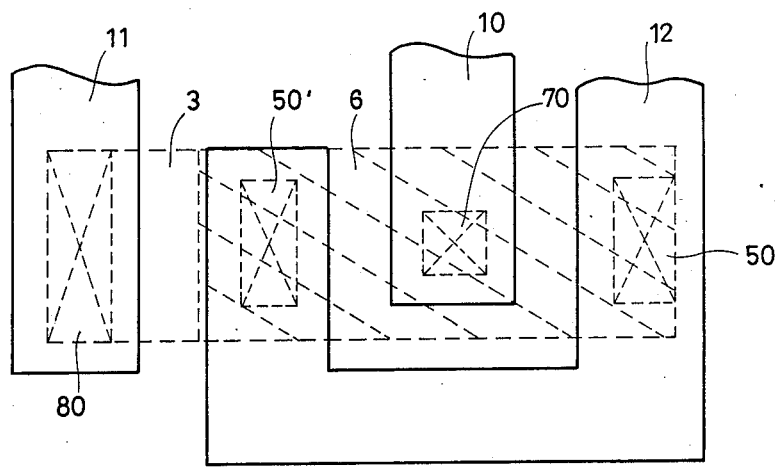
FIG. 5 is a plan pattern view of a conventional bipolar transistor of double base construction.
Figure 4A:
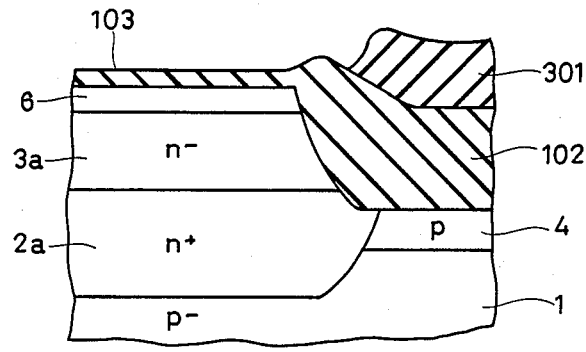
FIGS. 4A through 4C are sectional views, showing main successive fabrication steps, of a conventional bipolar transistor of walled emitter construction, illustrating problems inherent to the conventional bipolar transistor of walled emitter construction.
Figure 4B:
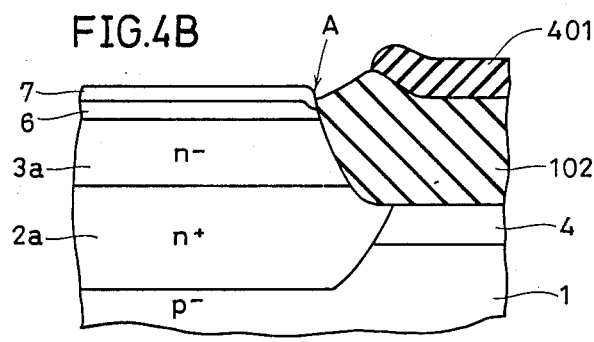
Figure 4C:
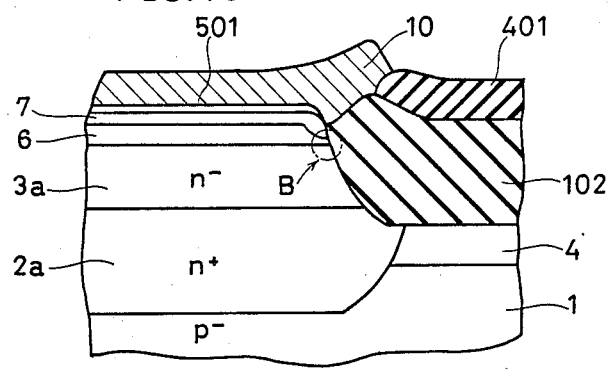
Figure 7:
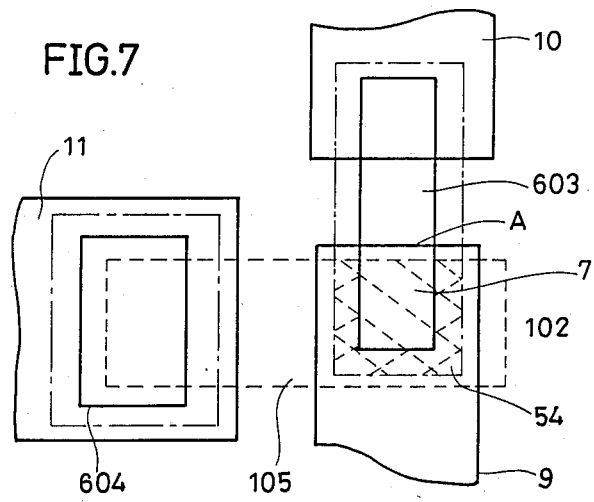
FIG. 7 is a plan pattern view of a semiconductor device fabricated according to an embodiment of the present invention.
Figure 8:
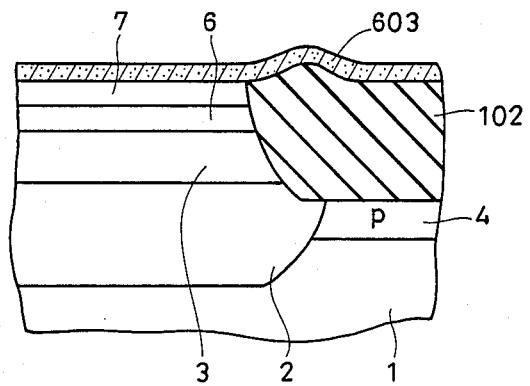
FIG. 8 is a sectional view taken adjacent the boundary of an isolation oxide film on a semiconductor device according to an embodiment of the present invention.

FIG. 7 is a plan pattern view of a transistor fabricated according to the embodiment of the invention described above, the view corresponding to the plan pattern view of the conventional transistor shown in FIG. 3. As shown in FIG. 7, since the polysilicon film 603 connected to the emitter electrode interconnection 10 serves as a source of diffusion for the emitter region 7, the emitter region 7 will contact the isolation oxide film 102 at A in the figure. Unlike the conventional method shown in FIGS. 4A through 4C, since the emitter region 7 is self-alignedly formed by diffusion of impurity from the polysilicon film 603, there is no possibility for the base region to be overetched in the vicinity of the isolation oxide film 102 to be narrowed. That is, as shown in FIG. 8, the emitter region 7 and the active base region 6, which are simultaneously formed through the polysilicon film 603, are substantially parallel to each other, and hence the base width is constant. Thus, because of the facts that the extended regions between the emitter and the base electrode are eliminated and that the base electrode lead-out region is self-alignedly formed in a minimum area, the base area is greatly reduced and so is the base-collector capacitance. Further, as can be seen in FIG. 7, the base electrode interconnection 9 is formed around the three sides of the emitter region 7, thus automatically providing a double base construction, whereby the base resistance is greatly reduced without increasing the base area.

Since the emitter junction is formed deeper than the surface of the external base region and at substantially the same depth as that of the surface of the base electrode lead-out layer, there is no absorption of electric current through recombination at the boundary surface, whereby dependence of current amplification factor on electric current in the low current region is reduced.

Figure 9:
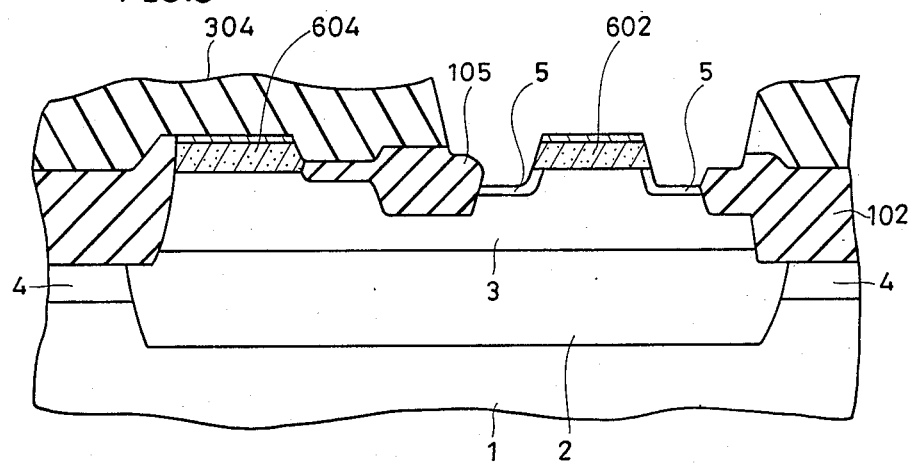
FIG. 9 is a sectional view showing a modification of a method of fabricating semiconductor devices according to an embodiment of the present invention.

Instead of performing diffusion of n-type impurity for forming the collector electrode lead-out region, the resist film 304 may be used as a mask in the process shown in FIG. 6G to remove the oxide film 106 in the base region, as shown in FIG. 9, whereupon p-type impurity implantation may be selectively effected, followed by an annealing treatment. In this process, diffusion of n-type impurity from the polysilicon film 604 having p-type impurity implanted therein takes place, so that the collector electrode lead-out layer can be formed.

A description will now be given of another embodiment of the invention, or a method of producing semiconductor devices which comprise bipolar transistors and base current feeding resistors.

FIGS. 10A through 10K are sectional views, taken at main successive fabrication steps, showing a method for fabricating semiconductor devices according to another embodiment of this invention. A method for fabricating semiconductor devices according to another embodiment of the present invention will now be described with reference to FIGS. 10A through 10K. A description of the portions corresponding to those of the embodiment shown in FIGS. 6A through 6J will be omitted.

Figure 10A:
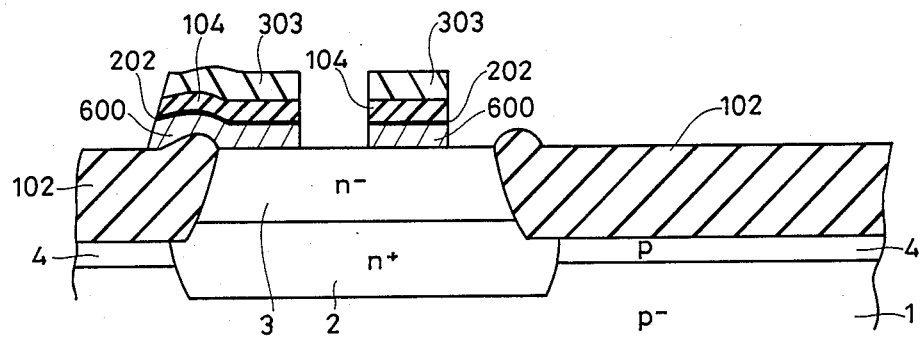

First, FIG. 10A will be referred. A p⁻-type silicon substrate 1 is provided, in predetermined regions thereof, with an n⁺-type collector buried layer 2, an n⁻-type epitaxial layer 3, a channel cutting p-type layer 4, an isolation oxide layer 102. The formation of each region is effected using the same method as the conventional method shown in FIGS. 1A and 1B. Then, the pad oxide film 101 and nitride film 201 shown in FIG. 1B are removed, whereupon a polysilicon film 600, a nitride film 202 and an oxide film 104 are formed on the semiconductor substrate 1 in the order mentioned. Subsequently, with a resist film 303 of predetermined pattern used as a mask, a multilayer film which consists of the polysilicon film 600, nitride film 202 and oxide film 104 is etched to be patterned. As a result of this patterning, a multilayer film consisting of an oxide film, 104, nitride film 202 and polysilicon film 600 is left only in the regions which will later serve as a collector electrode lead-out layer, a base layer and an emitter layer.

Figure 10B:
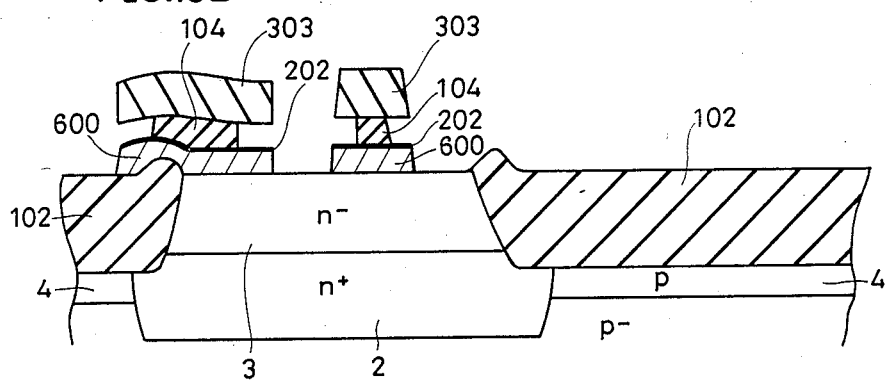

Reference will be made to FIG. 10B. The resist film 303 used for the patterning of the multilayer film in the step shown in FIG. 10A is then used as a mask for side-etching only the side wall of the oxide film 104 included in the multilayer film. As a result, the oxide film 104 recedes inwardly from the polysilicon film 600 and nitride film 202.

Figure 10C:
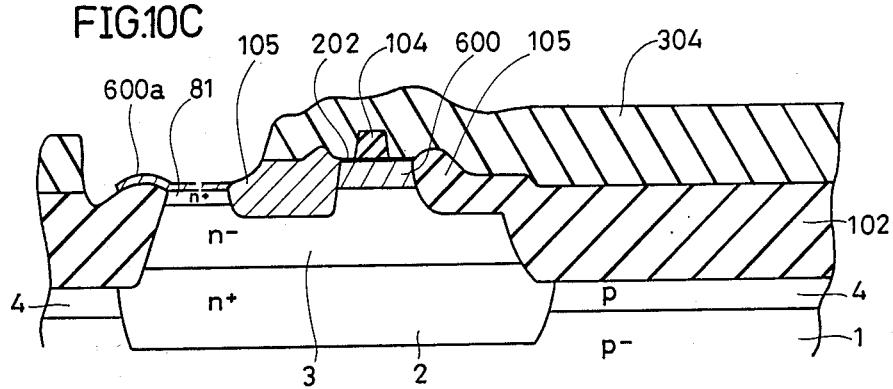

Reference will be made to FIG. 10C. After removal of the resist film 303, selective oxidation is effected using the nitride film 202 as a mask so as to form a relatively thick oxide film 105 on a predetermined region of the semiconductor substrate 1. A resist film 304 of predetermined pattern is newly formed and, using this resist film 304 as a mask, the oxide film 104 and nitride film 202 formed on the region which will serve as the collector electrode lead-out region are all removed by etching. In this process, the polysilicon film 600 is also thinned by etching. Then, an n+-type impurity diffusion layer 81 serving as the collector electrode lead-out layer is formed by diffusing an n-type impurity in high concentration through the polysilicon film 600a which is the polysilicon film 600 thinned by etching.

Reference will be made to FIG. 10D. After removal of the resist film 304, an oxide film 206 is formed on the polysilicon film 600a formed on the collector electrode lead-out layer 81 and, at the same time, diffusion of impurity from the n+-type impurity diffusion layer 81 is effected to form a collector electrode lead-out region 82. Simultaneously therewith, etching is effected using the oxide film 104 as a mask to effect the patterning of the nitride film 202 and polysilicon film 600. In this process, the underlying polysilicon film 600 extending beyond the nitride film 202 is all removed and the n⁻-type semiconductor region 3 is etched to some extent. This process may be replaced by etching away partly in thickness the polysilicon film 600 underlying the nitride film 202 to thin the portion extending beyond the nitride film 202, thereby making it easier to form an oxide film by oxidizing this portion (the thinned polysilicon film) during oxide film formation process in the next step.

Reference will be made to FIG. 10E. After removal of the oxide film 104 used for the patterning of the nitride film 202, selective oxidation is effected using the nitride film 202 as a mask to form an oxide film 106 on the surface of the semiconductor substrate between the polysilicon film 600 and the oxide film 105. The oxide film 106 covers the side wall of the polysilicon film 600. At the same time, the oxide film 206 on the collector electrode lead-out region 82 grows into a relatively thick oxide film 208 because of the presence of the underlying polysilicon film 602. Then, after removal of the nitride film 202, an n-type impurity is introduced, with the oxide films 106 and 105 used as masks, into the polysilicon film 600, thus forming a polysilicon film 601 containing a relatively highly concentrated n-type impurity. This impurity-containing polysilicon film 601 serves as an impurity diffusion source for the formation of the emitter region.

Reference will be made to FIG. 10F. The surface of the polysilicon film 601 containing n-type impurity is oxidized to form an oxide film 209, and then a second polysilicon film 610 is formed in a predetermined region on the isolation oxide film 102. This second polysilicon film 610 is used as a resistor.

Figure 10G:
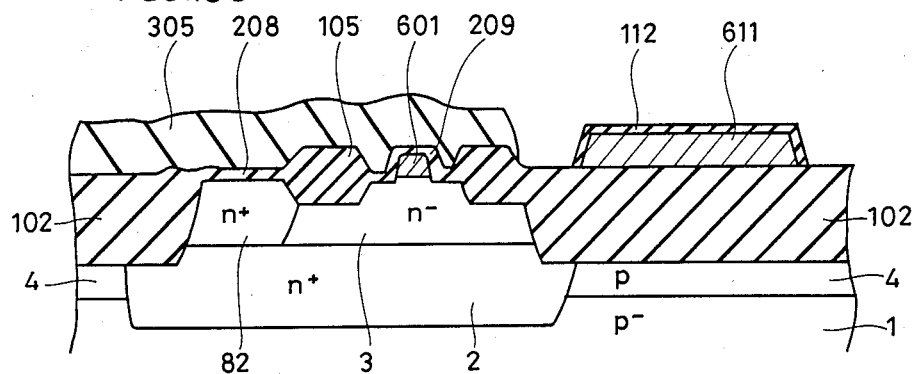

Reference will be made to FIG. 10G. The surface of the second polysilicon film 610 is oxidized to form an oxide film 112, and then resist film 305 is formed to cover the transistor region. Using this resist film 305 as a mask, a p-type impurity is ion-implanted to form a polysilicon film 611 serving as a resistor.

Figure 10H:
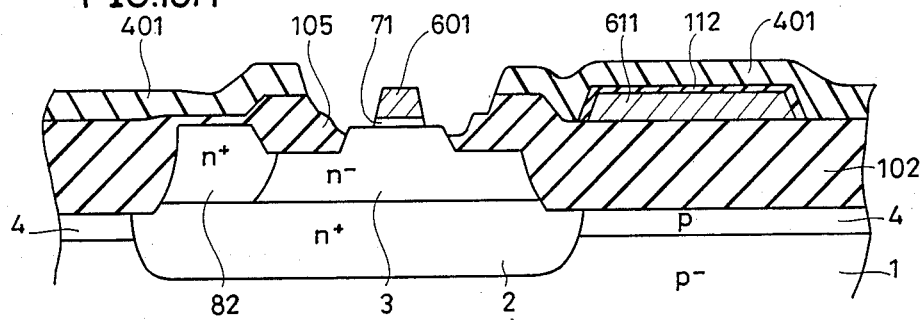

Reference will be made to FIG. 10H. After removal of the resist film 305, a PSG film 401 is deposited on the entire surface. Then a heat treatment which also serves for thermal shrinking of the PSG film 401 is applied to diffuse the n-type impurity from the n-type impurity containing polysilicon film 601 into the n⁻-type semiconductor region 3 located therebelow, so as to form an emitter layer 71. Subsequently, the portion of the PSG film 401 and the oxide film 109 formed on the region to be the base region are removed to form an opening, thus exposing the surfaces of the polysilicon film 601 and the region of the n⁻-type semiconductor substrate 3 serving as the external base region.

Figure 10I:
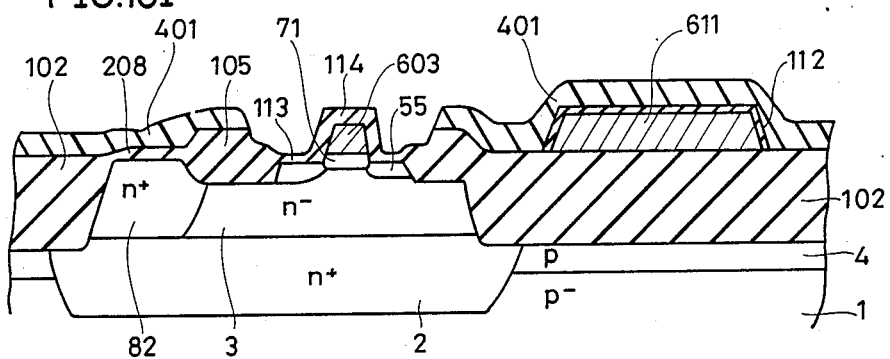

Reference will be made to FIG. 10I. An oxidation treatment at a low temperature of the order of 800°–900° C. is effected to form a thick oxide film 114 on the n+-type polysilicon film 601 and a thin oxide film 113 on the semiconductor region 3 in the base region (which will serve as the base electrode lead-out region), respectively. This is based on the well-known fact that in silicon or polysilicon which contains a highly concentrated n-type impurity such as phosphorus or arsenic, oxidation process the faster, the lower the temperature. Subsequently, a p-type impurity is ion-implanted through the thin oxide film 113 to form an ion-implanted layer 55. This ion-implanted layer 55 serves as an external base layer (base electrode lead-out layer). At this time, a p-type impurity is also implanted in the polysilicon film 601, so that the latter becomes a polysilicon film 603 containing a p-type impurity to serve as an impurity diffusion source during formation of the active base region. The oxide film 105 is left in order to prevent ion implantation in order to isolate the base and collector regions from each other. To this end, the oxide film 105 is as thick as 1 μm in the selective oxidation in FIG. 10C and the oxide film 106 is as thin as 200–300 nm in the selective oxidation in FIG. 10E.

Figure 10J:
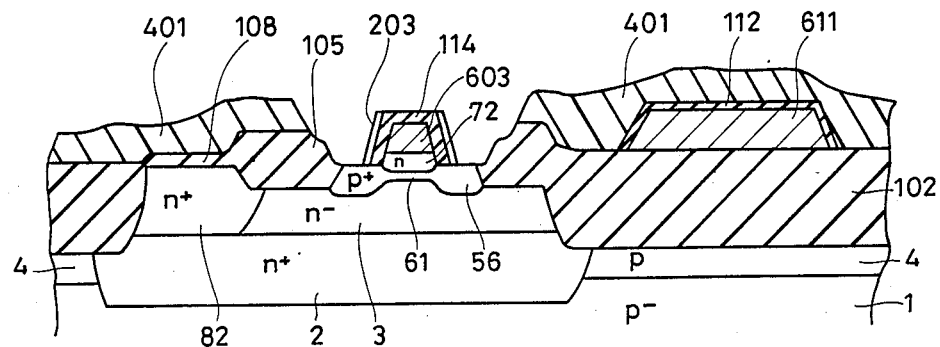

Reference will be made to FIG. 10J. The annealing of the p-type impurity implanted layer 55 is effected simultaneously with the diffusion of impurity from the impurity containing polysilicon film 603 into the n⁻-type layer 3. As a result, an active base region 61 is self-alignedly formed by the diffusion of p-type impurity from the polysilicon film 603, an external base region 56 is formed somewhat deeper and lower in resistance than the active base region 61, and an emitter region 72 is completed. This process is based on the difference in diffusion rate between p-type and n-type impurities. Further, anisotropic etching (RIE) is applied to the oxide film 114 formed on the polysilicon film 604 to remove the thin oxide film 113 formed on the external base region 56. Among methods for preventing the base electrode from being shorted to the emitter layer 72 is one which comprises the steps of depositing a nitride film 203 on the entire surface, effecting anisotropic etching in such a manner as to leave the nitride film 203 only on the side wall of the polysilicon film 603, and removing the oxide film 113, thus forming an insulation film consisting of oxide and nitride films on the side wall of the polysilicon film 604, FIG. 10J showing this state.

Figure 10K:
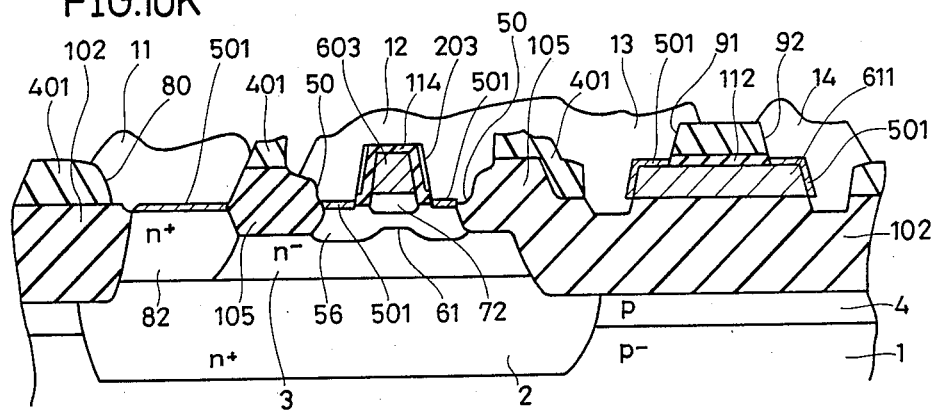

Reference will be made to FIG. 10K. First, the PSG film 401 and oxide film 208 on the collector electrode lead-out region 82 are removed to form an opening 80. At the same time, a contact hole for an emitter electrode (not shown in FIG. 10K) and contact holes 91 and 92 for a resister electrode are formed. Openings 50, 80, 91 and 92 are each formed with a metal silicide film 501 at the bottom thereof for preventing electrode penetration, whereupon a base electrode interconnection 12, an emitter electrode interconnection 10 (not shown in FIG. 10K), a collector electrode interconnection 11, a base-resistor electrode interconnection 13, and a resistor electrode interconnection 14 are formed using a low resistance metal such as Al. The opening 50 is a base electrode lead-out opening.

As can be seen in FIG. 10K, the emitter-to-base electrode distance is substantially equal to the sum of the thickness of the oxide film 114 and nitride film 203 on the polysilicon film 603, and therefore the base resistance is very low.

Figure 11:
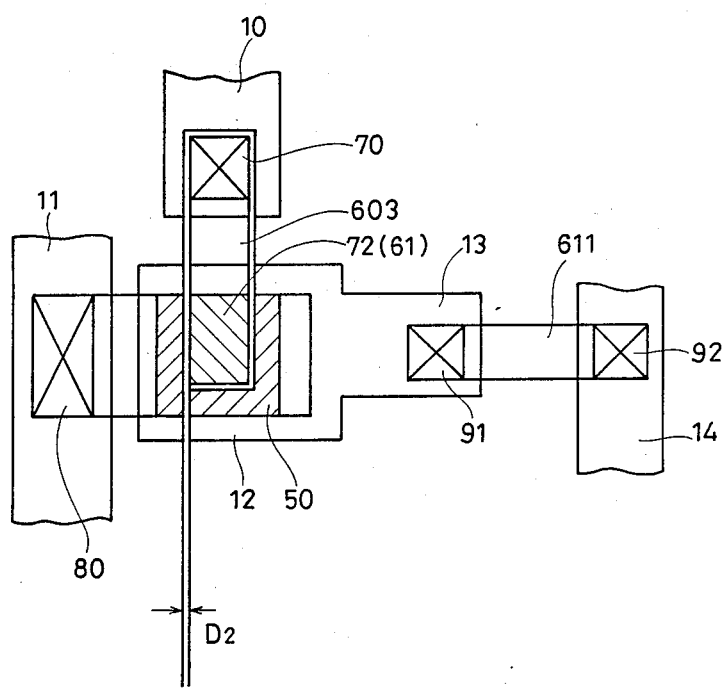
FIG. 11 is a plan pattern view of a semiconductor device fabricated by another embodiment of the invention.

FIG. 11 is a view showing the plan pattern of a transistor and a resistor connected thereto, fabricated according to another embodiment of the invention, the view corresponding to the plan pattern of the conventional transistor and a resistor connected thereto shown in FIG. 3. As shown in FIG. 11, in this fabrication method, too, a polysilicon film 603 connected to an emitter electrode interconnection 10 through an opening 70 serves as an impurity diffusion source for an emitter region 72. Further, base regions 56 and 61 are self-alignedly formed with respect to the mask used for the patterning of the polysilicon film 603, and on the side wall of the polysilicon film 603 is formed an insulation film only. Therefore, because of the fact that the portion protruding between the emitter and the base is eliminated and that the base electrode lead-out region (external base layer) 52 is self-alignedly formed in a minimum area, the base area is greatly reduced and so is the base-collector capacitance. Further, as can be seen in FIG. 11, the base electrode lead-out region 51 is formed around the three sides of the emitter region 72, resulting in a double base construction which greatly reduces the base resistance without an increase in the base region. Further, since the resistor is formed of a polysilicon film on a thick oxide film (isolation oxide film), stray capacitance is greatly reduced, contributing to improvements in frequency characteristic and other properties of the semiconductor device.

In the above embodiments, polysilicon films have been used to provide an impurity diffusion source for the formation of the emitter region and to provide a base current feeding resistor. However, the same effect can be obtained even if a single crystalline silicon film or a non-crystalline silicon film is used.

Further, the present invention is also applicable to the fabrication of pnp transistors.

According to this invention, an emitter region and a base region are self-alignedly formed and an insulation film only is provided between the emitter and base electrodes. As a result of this arrangement, the insulation film alone is present between the silicon film on the emitter region and the metal electrode film on the base region, thus effectively reducing the emitter-to-base distance, whereby the frequency characteristic of the semiconductor device is improved.

Further, since the base electrode lead-out region is formed self-alignedly in a minimum area with respect to the pattern for formation of the emitter region, the area of the inactive base region can be greatly reduced and so can be the base-collector capacitance.

Further, as a result of the so-called bird beak intrusion during side-etching and selective oxidation, the pattern size of the polysilicon film 603 forming the emitter region is reduced to less than ⅓ times the pattern size of the resist film 303 in FIGS. 6A and 6B, so that emitter regions having a width of the order of submicrons can be easily implemented.

Further, where the emitter junction is formed shallower than the surface of the external base region and at the same depth as that of the surface of the base electrode lead-out region, the dependence of current amplification factor of transistors on electric current can be minimized.

Further, since the resistor is formed by the polysilicon film formed on the isolation oxide film, there is no need for a region for isolating the transistor and the resistor and there formed almost no capacitance in the resistor region, affecting no bad influence on frequency characteristic.

Thus, a semiconductor device with improved frequency characteristic can be attained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method for fabricating a semiconductor device which has an emitter region (7), a collector region (3, 8), and a base region consisting of a base electrode lead-out region (54) and an active base region (6), said method comprising the steps of:

forming multilayer having a silicon film (600), a nitride film (202) and a first oxide film (104) stacked in the order mentioned at a predetermined region on a semiconductor substrate (1) of first conductivity type, side-etching said first oxide film (104) alone so as to be receded inwardly from said silicon and nitride films (600, 202) of said multilayer, effecting selective oxidation with said nitride film (202) used as a mask to form a second oxide film (105) on a predetermined region of said semiconductor substrate (1) for isolating said collector (8) and base (54) regions from each other, selectively etching away said silicon and nitride films (600, 202) by using said side-etched first oxide film (104) as a mask, forming a third oxide film (106) on the region which serves as said base electrode lead-out region (54) by effecting selective oxidation using said selectively etched nitride film (202) as a mask, introducing impurity of said first conductivity type into said silicon film (602) by using said third oxide film (106) as a mask, forming said emitter (7) and base (6) regions by introducing an impurity of second conductivity type with said second oxide film (105) used as a mask and then applying a heat treatment, forming an insulation film (107, 203) on the side wall of said silicon film (603) by using anisotropic etching, and forming an emitter electrode interconnection (10) through a contact hole formed in a predetermined region of said silicon film (603) while forming a base electrode interconnection (9) on said base electrode lead-out region (54).

2. A method for fabricating a semiconductor device as set forth in claim 1, wherein said selective etching in said fourth mentioned step is such that the surface of the semiconductor substrate in the region serving as said base electrode lead-out region (54) is etched to a predetermined depth.

3. A method for fabricating a semiconductor device as set forth in claim 1, wherein said selective etching in said fourth mentioned step is such that the silicon film (600) in the region serving as said base electrode lead-out region (54) is etched away by a predetermined film thickness.

4. A method for fabricating a semiconductor device as set forth in claim 1, wherein said third oxide film (106) is removed before or after the introduction of the impurity of said second conductivity type.

5. A method for fabricating a semiconductor device as set forth in claim 4, wherein said eighth mentioned step comprises the steps of:
forming a fourth oxide film (108) by oxidation at a low temperature, and
applying anisotropic etching to said fourth oxide film (108, 107) in such a manner as to leave said fourth oxide film (107) only on the side wall of said silicon film (603).

6. A method of producing semiconductor devices as set forth in claim 4, wherein said eighth mentioned step comprises the steps of:

forming a fourth oxide film (108, 107) by oxidation at a low temperature,
forming a nitride film (203) on said fourth oxide film (107), and
forming an insulation film consisting of an oxide film and a nitride film on the side wall of said silicon film and said fourth oxide film by applying anisotropic etching to said nitride film.

7. A method for fabricating a semiconductor device as set forth in claim 1, further comprising a step of transforming the upper portion of said silicon film (603) into a metal silicide (701) after said sixth mentioned step.

8. A method for fabricating a semiconductor device as set forth in claim 1, further comprising a step of forming a metal silicide film (501) on the surface of said base electrode lead-out region (56) after said eight mentioned step.

9. A method for fabricating a semiconductor device as set forth in claim 1, wherein said semiconductor device has a resistor connected to said base region (61) and is electrically isolated from an adjacent semiconductor device by an isolation oxide film (102), and wherein the step of forming said resistor comprises the steps of:
forming a silicon film (610) on said isolation oxide film (102), and
introducing an impurity of first conductivity type into said silicon film (610).

10. A method for fabricating a semiconductor device as set forth in claim 1, wherein said silicon film (600) is one selected from the group consisting of a single crystalline silicon film, a non-crystalline silicon film and a polycrystalline silicon film.

* * * * *